United States Patent
Cosley et al.

(10) Patent No.: US 7,505,269 B1
(45) Date of Patent: Mar. 17, 2009

(54) THERMAL ENERGY STORAGE TRANSFER SYSTEM

(75) Inventors: Michael Cosley, Crystal Lake, IL (US); Marvin Garcia, Carol Stream, IL (US); John Teter, North Aurora, IL (US)

(73) Assignee: Valere Power Inc., Richardson, TX (US)

( * ) Notice: Subject to any disclaimer, the term of this patent is extended or adjusted under 35 U.S.C. 154(b) by 0 days.

(21) Appl. No.: 11/870,702

(22) Filed: Oct. 11, 2007

(51) Int. Cl.
  *H05K 7/20* (2006.01)
  *F28F 7/00* (2006.01)

(52) U.S. Cl. .............. 361/700; 165/80.3; 165/104.33; 361/690; 361/694; 361/695

(58) Field of Classification Search ............ 165/104.33; 361/690, 700
See application file for complete search history.

(56) References Cited

U.S. PATENT DOCUMENTS

| | | | |
|---|---|---|---|
| 4,600,050 A | 7/1986 | Noren | |
| 5,508,908 A * | 4/1996 | Kazama et al. | 363/141 |
| 5,579,830 A | 12/1996 | Giammaruti | |
| 5,842,514 A * | 12/1998 | Zapach et al. | 165/104.33 |
| 5,890,371 A | 4/1999 | Rajasubramanian et al. | |
| 6,062,299 A | 5/2000 | Choo et al. | |
| 6,084,772 A | 7/2000 | Pell et al. | |
| 6,310,772 B1 * | 10/2001 | Hutchison et al. | 361/700 |
| 6,578,491 B2 | 6/2003 | Babin | |
| 6,631,755 B1 | 10/2003 | Kung et al. | |
| 6,760,222 B1 | 7/2004 | Wang | |
| 6,795,316 B2 * | 9/2004 | Owens et al. | 361/704 |
| 6,997,241 B2 | 2/2006 | Chou et al. | |
| 2002/0080577 A1 * | 6/2002 | Babcock et al. | 361/687 |
| 2004/0011503 A1 | 1/2004 | Kung et al. | |
| 2004/0112583 A1 | 6/2004 | Garner et al. | |

\* cited by examiner

*Primary Examiner*—Gregory D Thompson
(74) *Attorney, Agent, or Firm*—Barnes & Thornburg LLP

(57) ABSTRACT

A thermal energy storage transfer system that is adapted to transfer heat from an electronics enclosure. The thermal energy storage system includes a thermal energy storage unit that is positioned within the electronics enclosure. The thermal energy storage unit contains a phase change material that stores heat created by electronics stored within the electronics enclosure and transfers the heat to outside of the electronics enclosure by use of a heat pipe and condenser.

17 Claims, 8 Drawing Sheets

THERMAL ENERGY STORAGE TRANSFER SYSTEM

BACKGROUND

The present disclosure relates, generally, to heat transfer systems and, by way of example and not limitation, to a method and apparatus for managing thermal transients through the use of a thermal energy storage and transfer system.

According to the present disclosure, a thermal energy storage transfer system comprises a thermal energy storage unit that is adapted to absorb and transfer heat from an enclosure. In illustrative embodiments, the thermal energy storage system includes the thermal energy storage unit that is positioned within an electronics enclosure. The thermal energy storage unit includes a main housing that contains a phase change material, which stores heat generated by electronics stored within the electronics enclosure. The main housing also contains an embedded conductive material that is used to transfer heat from the phase change material to a heat pipe, which is coupled to a condenser. The thermal energy storage unit also includes a heat sink that is used to capture heat created by the electronics within the electronics enclosure.

In illustrative embodiments, the thermal energy storage system includes a condenser housing that is coupled to the main housing. The condenser housing is adapted to support the condenser and is positioned within a convection chimney to allow air, passing upwardly through the chimney, to pass through the condenser prior to exiting the chimney to dissipate heat.

Additional features of the disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The present invention and the advantages thereof will become more apparent upon consideration of the following detailed description when taken in conjunction with the accompanying drawings of which.

DETAILED DESCRIPTION

Figure 1:
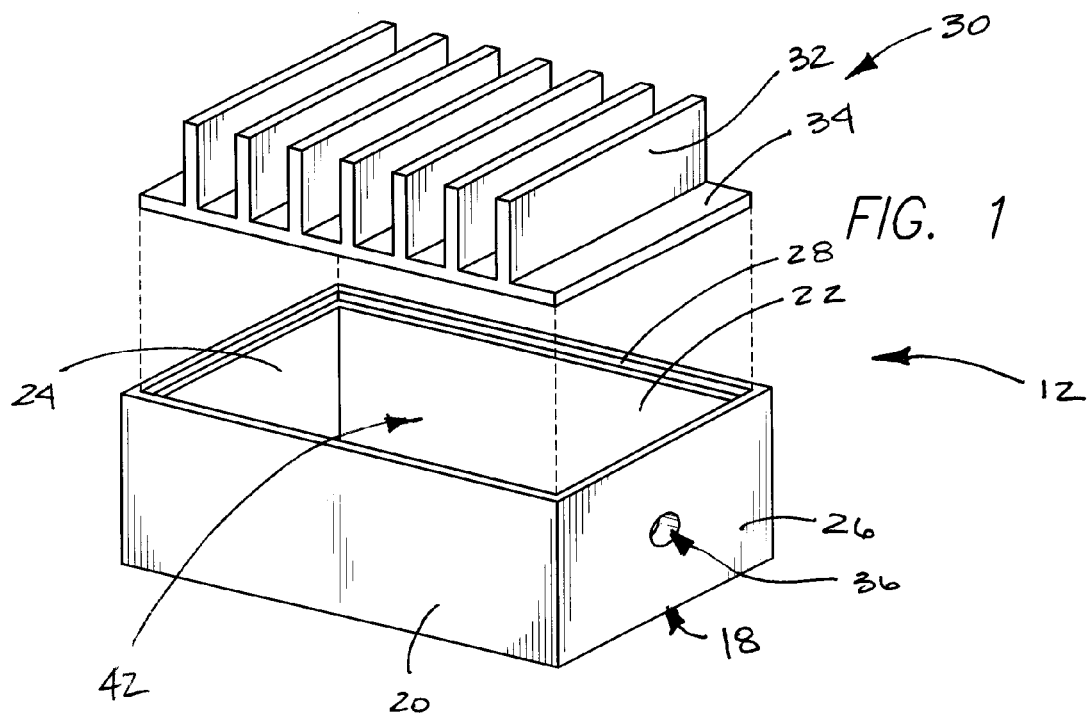
FIG. 1 is a perspective view of a portion of a thermal energy storage unit showing a housing and a heat sink positioned above the main housing.

While the present disclosure may be susceptible to embodiments in different forms, they are shown in the drawings, and herein will be described in detail, embodiments with the understanding that the present description is to be considered an exemplification of the principles of the disclosure and is not intended to limit the disclosure to the details of construction and the arrangement of components set forth in the following description or illustrated in the drawings.

Figure 2:
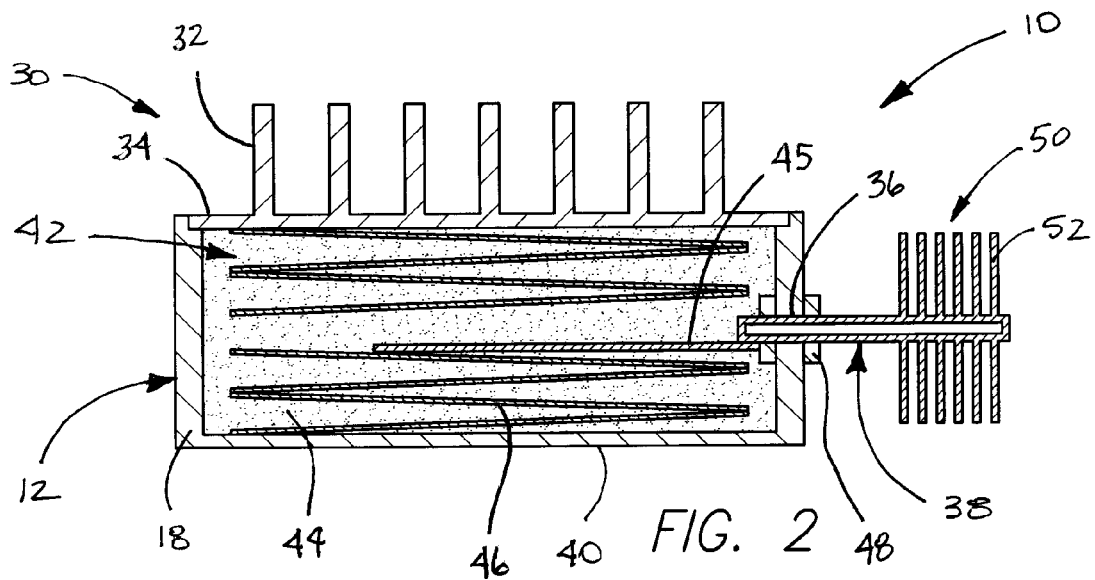
FIG. 2 is a cross-sectional view taken along line 2-2 of FIG. 4a showing the heat sink coupled to the housing, which is filled with a phase change material and an embedded conductive material and also showing a heat pipe coupled to the housing at a first end and a condenser at a second end.
Figure 3:
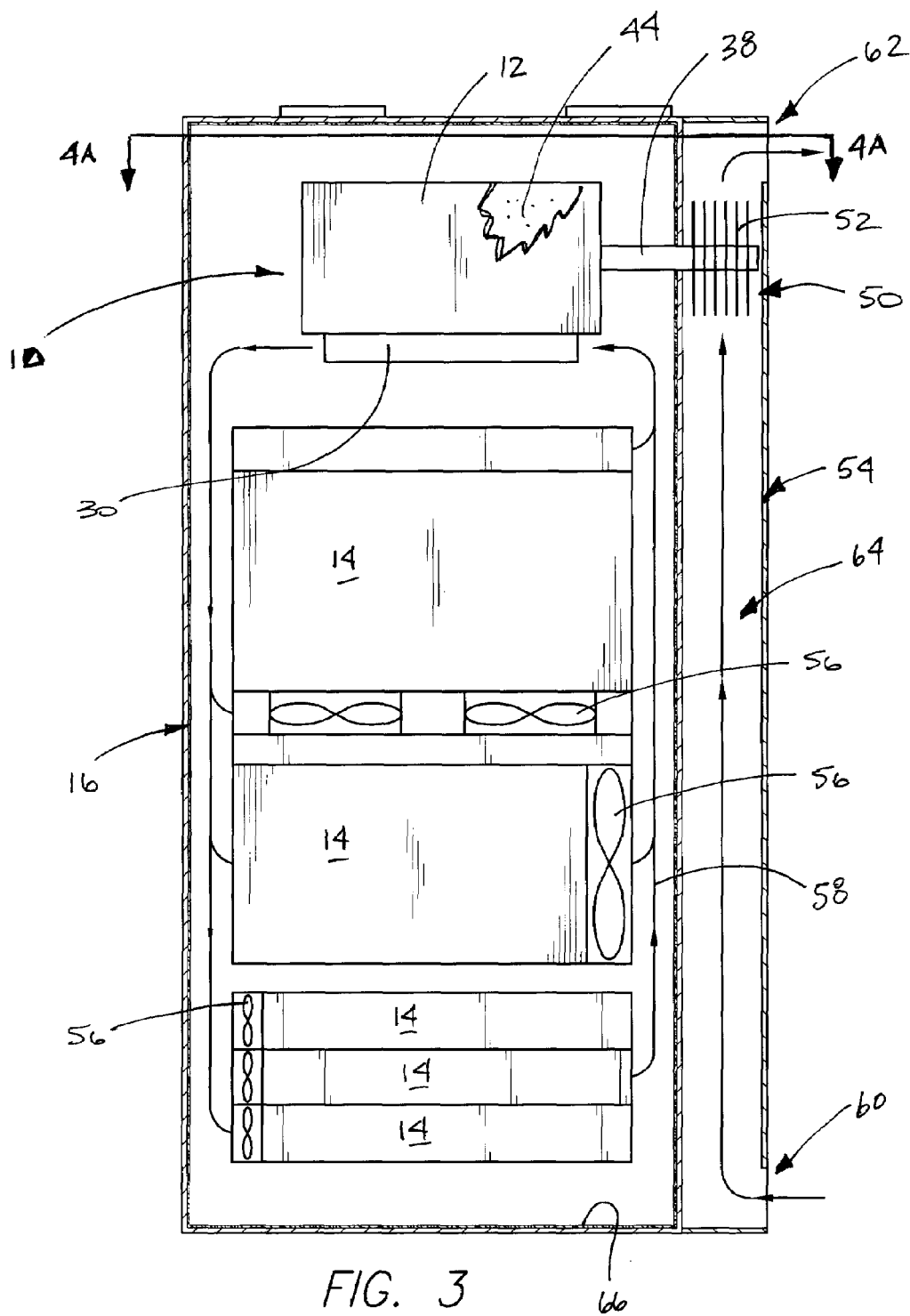
FIG. 3 is a cross sectional, side elevational view of the thermal energy storage unit positioned within an electronics enclosure, showing the thermal energy storage unit positioned above the electronics equipment to absorb heat generated by the equipment and also showing the heat pipe passing through the right side of the electronics enclosure into a convection chimney that houses a series of condenser fins coupled to the heat pipe.

A thermal energy storage transfer system 10 is adapted to store heat created by electronics equipment 14 and transfer the heat from an electronics enclosure 16, as shown, for example, in FIG. 3. The thermal energy storage transfer system 10 is used to regulate temperature within electronics enclosure 16 during peak heat loads to reduce the likelihood of damage to electronics equipment 14. In illustrative embodiments, thermal energy storage transfer system 10 comprises a thermal energy storage unit 12 that includes a main housing 18, as shown, for example, in FIGS. 1 and 2. Thermal energy storage transfer system 10 is a passive heat storage and transfer system that does not require electricity and does not include any mechanical moving parts.

Main housing 18 of the thermal energy storage unit 12 includes first and second side walls 20, 22 and first and second end walls 24, 26, as shown, for example, in FIGS. 1 and 2. Main housing 18 also includes a ridge 28 that is adapted to accept a heat sink 30. End wall 26 of main housing 18 is formed to include an aperture 36 that is adapted to accept a heat pipe 38, as shown, for example, in FIG. 2. Main housing 18 is preferably manufactured from plastic to minimize the heat gain/loss through main housing 18, forcing heat sink 30 and phase change material 44 to absorb the heat.

Main housing 18 of thermal energy storage unit 12 also includes bottom wall 40. Side walls 20, 22, end walls 24, 26, and bottom wall 40 together form receiving chamber 42, as shown, for example, in FIGS. 1 and 2. Receiving chamber 42 of main housing 18 is adapted to contain a phase change material 44. Phase change material 44 can consists of a variety of materials that change from one phase to another during the application of heat, such as, for example, paraffin wax. Phase change material 44 absorbs the heat created by electronics equipment 14 positioned within electronics enclosure 16. Phase change material 44 is able to store approximately five to ten times more heat per unit volume of sensible storage than materials such as, water and masonry, for example and has a low thermal conductivity.

Phase change materials are "latent" thermal storage materials. They use chemical bonds to store and release heat. The thermal energy transfer occurs when a material changes from a solid to a liquid or from a liquid to a solid form. This is called a change in state or "phase." Initially, these solid-liquid phase changing materials ("PCMs") perform like conventional storage materials; their temperature rises as they absorb solar heat.

Unlike conventional heat storage materials, when PCMs reach the temperature at which they change phase (their melting point), they absorb large amounts of heat without getting hotter. Using PCMs it is possible to store large amounts of heat with only small temperature change since it has a high storage density. When the ambient temperature in the space around the PCM material drops, the PCM solidifies, releasing its stored latent heat. PCMs absorb and emit heat while maintaining a nearly constant temperature.

Positioned within phase change material 44 is an embedded conductive material 46. One embodiment of conductive material 46, as shown in the illustrative embodiments, is a foraminous or screen-type material that is positioned within main housing 18. Conductive material 46 is adapted to aid in removing heat from phase change material 44 to heat pipe 38. Conductive material 46 is coupled to heat pipe 38 and base plate 34 of heat sink 30. Conductive material 46 may also be coupled to metallic plate 45 that, in turn, is coupled to heat pipe 38. While a metallic mesh-type of conductive material 46 is shown, it is contemplated that other heat distributing materials could also be used to distribute heat through phase change material 44, such as a series of conductive plates, metal foam or metal fiber. Conductive material 46 is used to improve the Y-axis conductivity, which results in more uniform temperature throughout phase change material 44.

Heat sink 30 is adapted to capture heat emitted by electronics equipment 14 positioned within electronics enclosure 16, as shown, for example, in FIG. 1. Heat sink 30 includes base plate 34 that is coupled to main housing 18 by use of epoxy or other means to secure base plate 34 to main housing 18 to prevent the release of phase change material 44 from main housing 18. Base plate 34 of heat sink 30 creates a bottom wall to seal off main housing 18.

Heat sink 30 also includes a series of fins 32 that extend outwardly from base plate 34. Fins 32 capture heat from within electronics enclosure 16 and transfers the heat to phase change material 44. While heat sink 30 is preferably made from extruded aluminum, other heat sink materials can also be used to capture and transfer heat to the phase change material such as cast aluminum. Heat sink 30 can also be bonded (thermal epoxy), fin, or brazed fin (folded foil).

Heat pipe 38 of thermal energy storage transfer, systems 10 is a heat transfer mechanism that can transport large quantities of heat with a very small difference in temperature between the hot and cold interfaces. Heat pipe 38 consists of a sealed hollow tube formed from a thermal conductive metal such as copper or aluminum. Heat pipe 38 contains a relatively small quantity of a "working fluid" or coolant (such as water, ethanol or mercury) with the remainder of the pipe being filled with vapor phase of the working fluid, all other gases being excluded.

Heat pipe 38 is coupled to conductive material 46 by use of metallic plate 45 and passes through aperture 36 of main housing 18. Heat pipe 38 is sealed to main housing 18 by use of epoxy 48 or other sealing material, as shown, for example in FIG. 2. Depending upon the size of main housing 18, multiple heat pipes 38 can be used. Heat pipe 38 transfers heat from phase change material 44 of main housing 18 to condenser 50. The exact number of heat pipes 38 is a function of length, diameter, wick material, working fluid, operating temperature, among other factors. Main housing 18 is sized for desired heat lift, then the number of heat pipes 38 and the type of phase change material 44 are selected when sizing a system.

Condenser 50 is coupled to heat pipe 38 and is adapted to release heat captured by phase change material 44 of thermal energy storage unit 12. Condenser 50 includes a series of fins 52 that are positioned within a convection chimney 54, as shown, for example, in FIG. 3. Condenser 50 and chimney 54 drive the ability to form an updraft resulting in natural convection. The number of fins 52 used with condenser 50 is dependent upon the size of the thermal energy storage unit 12 and the amount of heat that needs to be removed from electronics enclosure 16. Electronics enclosure 16 may include one or more pieces of electronics equipment 14.

Fans 56 mounted to electronics equipment 14 pull heat from the equipment and move the heat in direction 58 toward heat sink 30, as shown, for example, in FIG. 3. Heat sink 30 absorbs heat generated by the electronics equipment 14 and transfers the heat to phase change material 44. Phase change materials or PCMs can be broadly grouped into two categories; "Organic Compounds" (such as polyethylene glycol) and "Salt-based Products" (such as Glauber's salt). Other types of PCMs include salt hydrates, fatty acids and esters, and various paraffins (such as octadecane).

Condenser 50 is positioned within convection chimney 54, as shown, for example, in FIG. 3. Chimney 54 is coupled to electronics enclosure 16 and includes an inlet 60 positioned near the bottom of chimney 54 and an outlet 62 that is positioned near the top of chimney 54. Chimney 54 also includes a passageway 64 that extends vertically between inlet 60 and outlet 62. Chimney 54 includes insulation to minimize solar gain in the chimney 54. Solar gain from sun exposure would result in lower performance since a thermal boundary layer grown in the outer walls would limit internal air flow. Condenser 50 is positioned within passageway 64 near outlet 62. Heat released by condenser 50 causes hot air to rise and escape from outlet 62, which, in turn, causes cool air to be drawn into inlet 60. Electronics enclosure 16 includes reflective insulation 66 that reduces the amount of radiant heat from the sun that enters electronics enclosure 16 and reflects heat toward thermal energy storage unit 12.

Figure 4A:
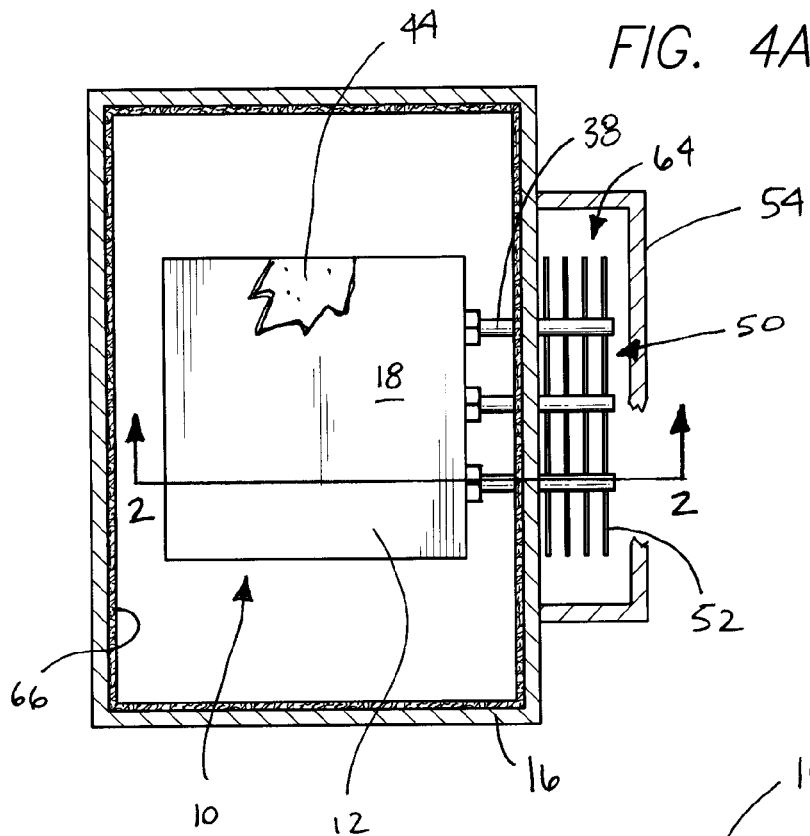
FIG. 4a is a cross sectional view taken along line 4a-4a of FIG. 3 showing the thermal energy storage unit positioned within the electronics enclosure and also showing three heat pipes passing through the side wall of the electronics enclosure into the convection chimney where a series of condenser fins are positioned.
Figure 4B:
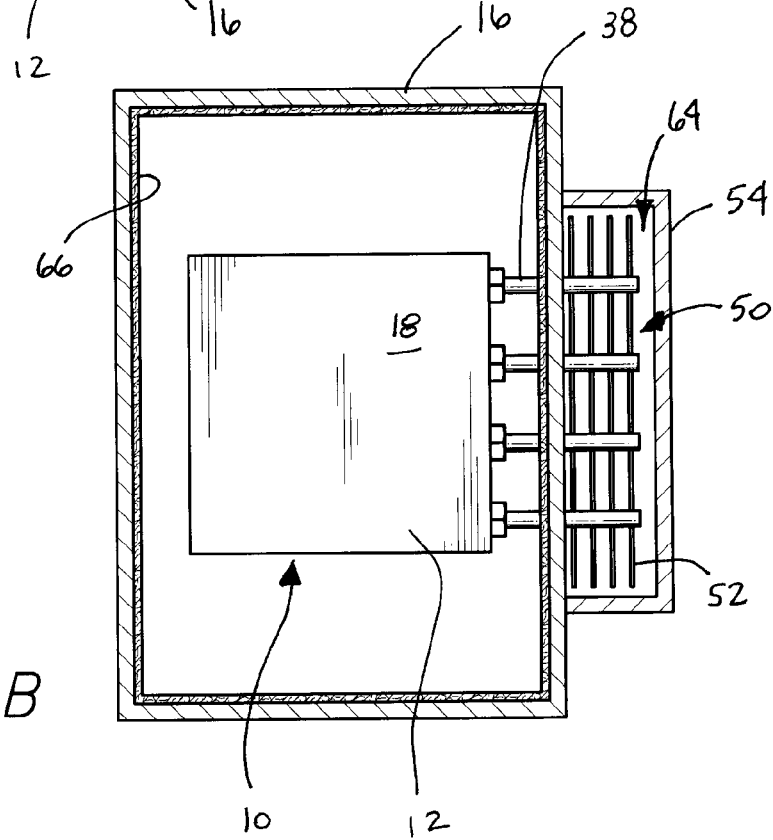
FIG. 4b is a cross sectional view similar to FIG. 4a showing four heat pipes coupled to the housing of the thermal energy storage unit and passing through the wall of the electronics enclosure into the convection chimney and also showing a series of condenser fins coupled to the heat pipes to dissipate heat from the thermal energy storage unit.

FIGS. 4a and 4b illustrate variations in the size of the thermal energy storage transfer system 10. Both systems include a thermal energy storage unit 12 having a main housing 18 that is positioned within electronics enclosure 16. The thermal energy storage transfer system 10 of FIG. 4a is smaller than the thermal energy storage transfer system 10 of FIG. 4b in that housing 18 of FIG. 4a includes three heat pipes 38 and is design to handle a smaller heat load. The thermal energy storage transfer system 10 of FIG. 4b includes four heat pipes 38 and a greater condenser 50 to handle a greater heat load.

Figure 5:
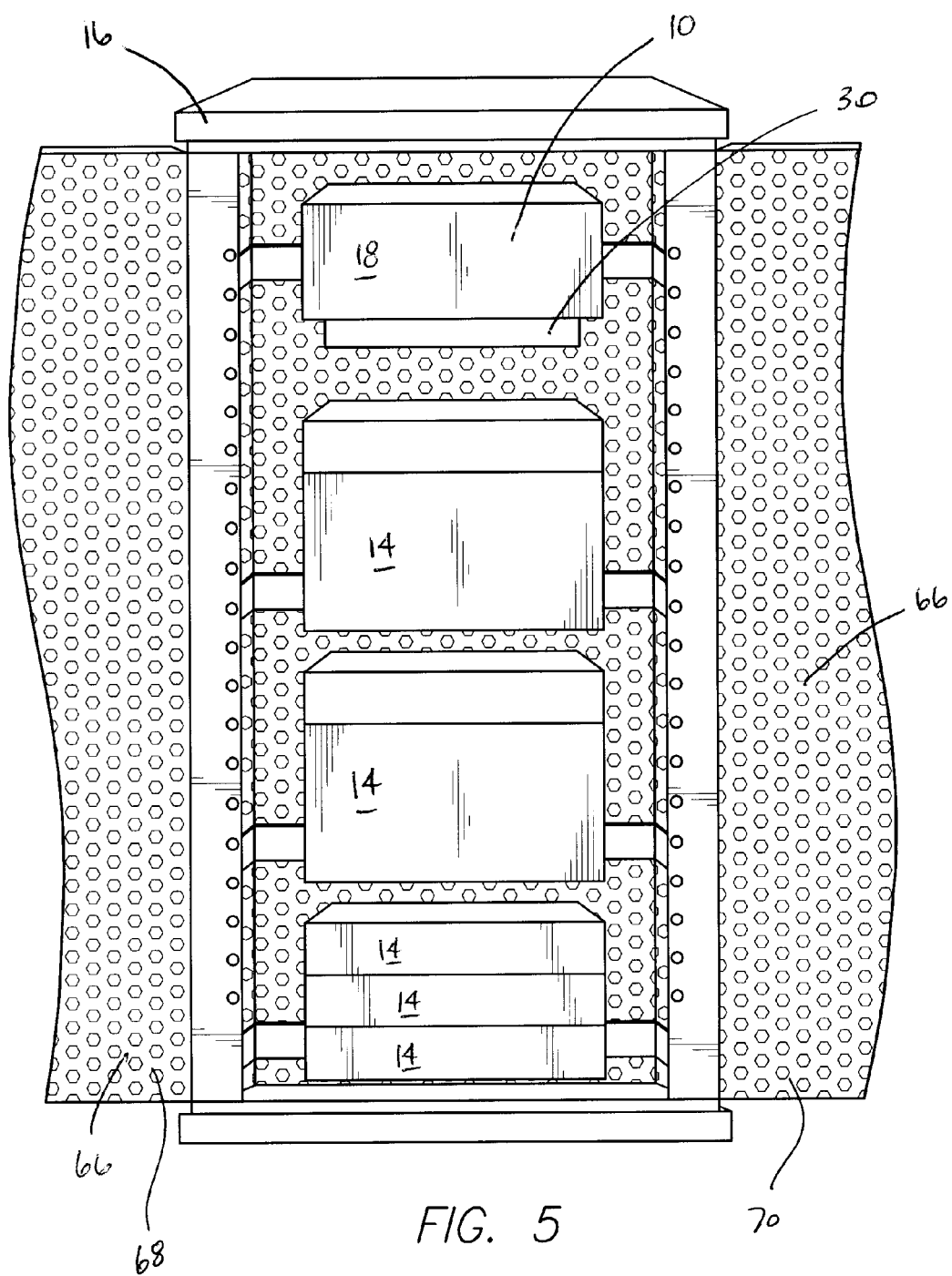
FIG. 5 is a perspective view of the electronics enclosure with the doors in an open position showing the thermal energy storage transfer system at the top of the enclosure and the electronic components positioned below, and also showing a reflective insulating material lining the inner walls of the enclosure.

Thermal energy storage system 10 is positioned at the top of electronics enclosure 16, as shown for example, in FIG. 5 to absorb heat created by electronics equipment 14. While one thermal energy storage system 10 is shown, additional systems can be used within electronics enclosure 16 to increase heat storage and transfer capacity. Electronics enclosure 16 may include doors 68, 70 to permit access to electronics equipment 14. To keep dust and other contaminants out of electronics enclosure 16, doors 68, 70 are sealed and there are no ventilation openings into the electronics enclosure 16.

Figure 6:
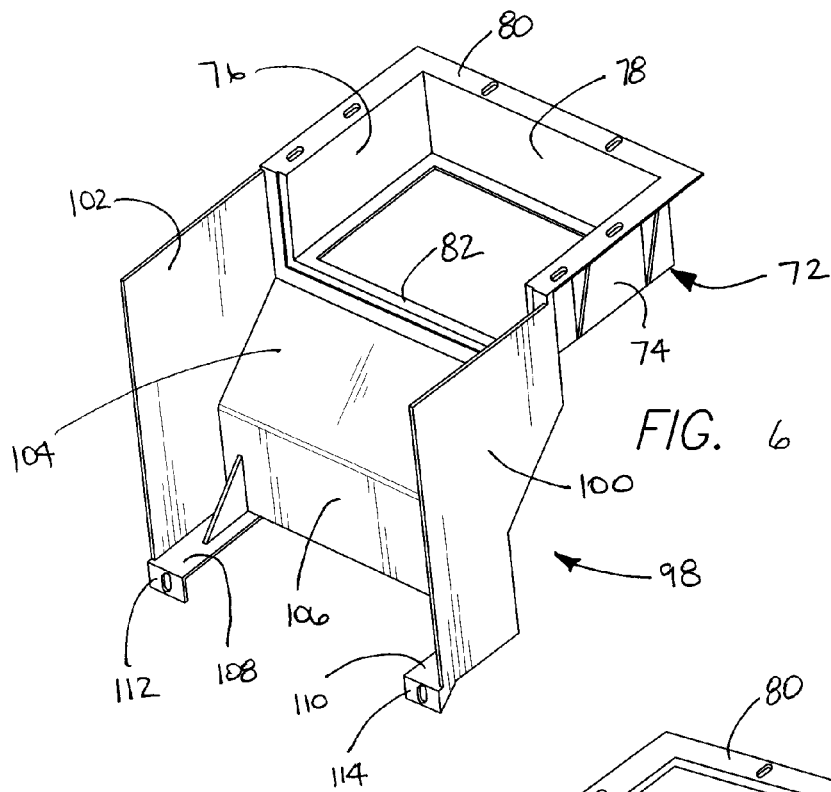
FIG. 6 is a perspective view of the thermal energy storage unit showing the main housing coupled to a condenser housing.
Figure 7:
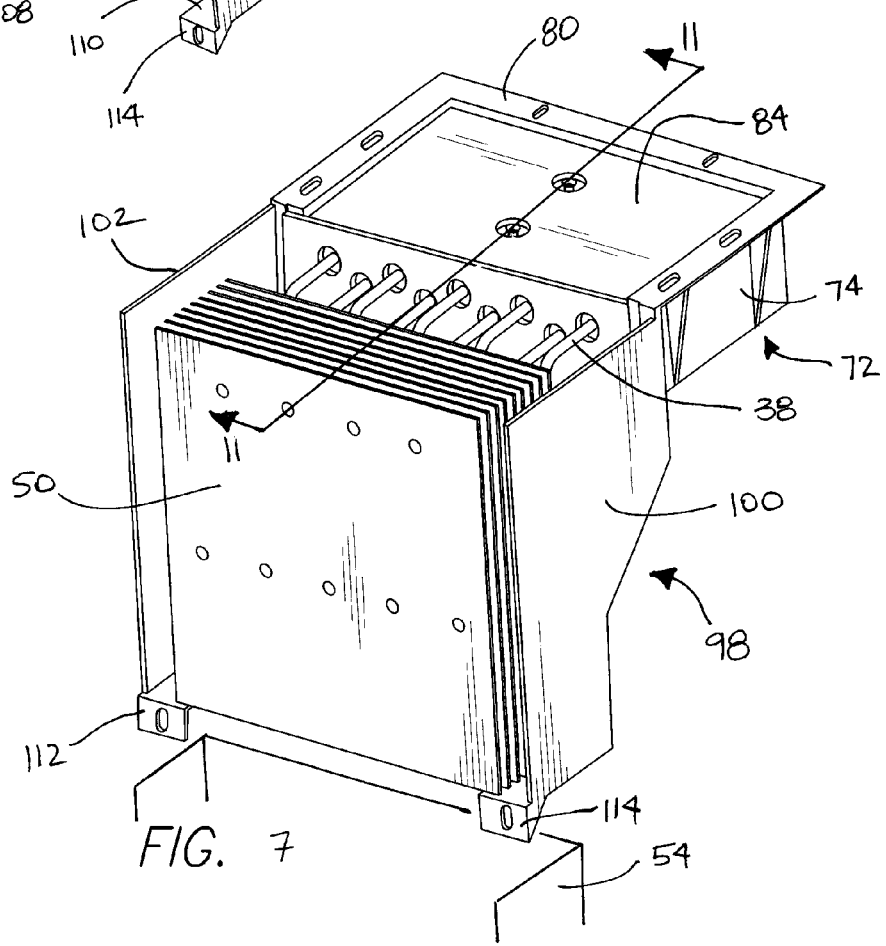
FIG. 7 is a perspective view of the thermal energy storage unit showing the condenser and a plurality of heat pipes positioned within the condenser housing and the top cover of the main housing.
Figure 8:
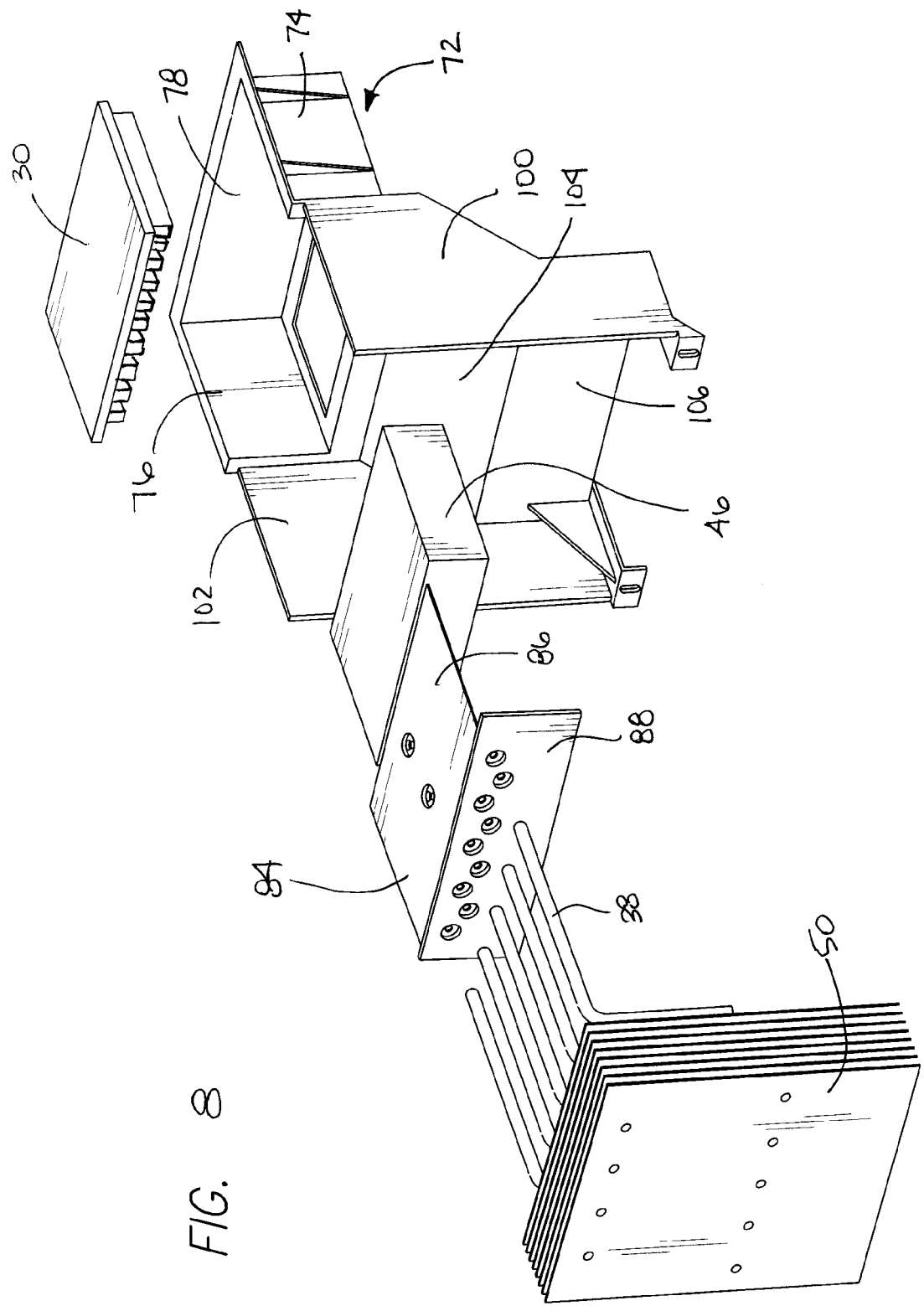
FIG. 8 is an exploded perspective view of the thermal energy storage unit of FIG. 7 showing the condenser on the left side of the figure followed by four heat pipes, the top cover, the conductive screen, and the housing and also showing the heat sink positioned above the housing.

Alternatively, housing 72 can be used to contain phase change material 44, as shown, for example, in FIG. 7. Housing 72 includes side walls 74, 76 and back wall 78, as shown, for example, in FIG. 6. Housing 72 also includes top flange 80 and spaced apart bottom flange 82. Bottom flange 82 of housing 72 is adapted to accept heat sink 30. Heat sink 30 is coupled to bottom flange 82 by use of epoxy, fasteners or other means to couple heat sink 30 to bottom flange 82. Housing 72 also includes a cover 84.

Figure 10:
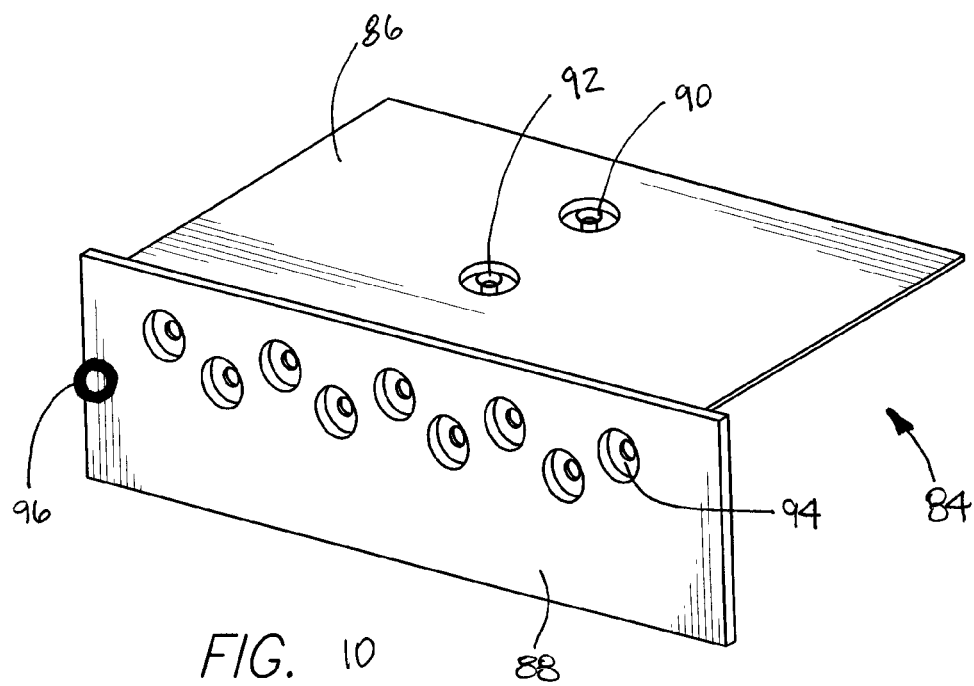
FIG. 10 is a perspective view of the top cover showing a side wall having a series of openings adapted to accept heat pipes and a top wall having vent and fill ports used to add the phase change material.
Figure 9:
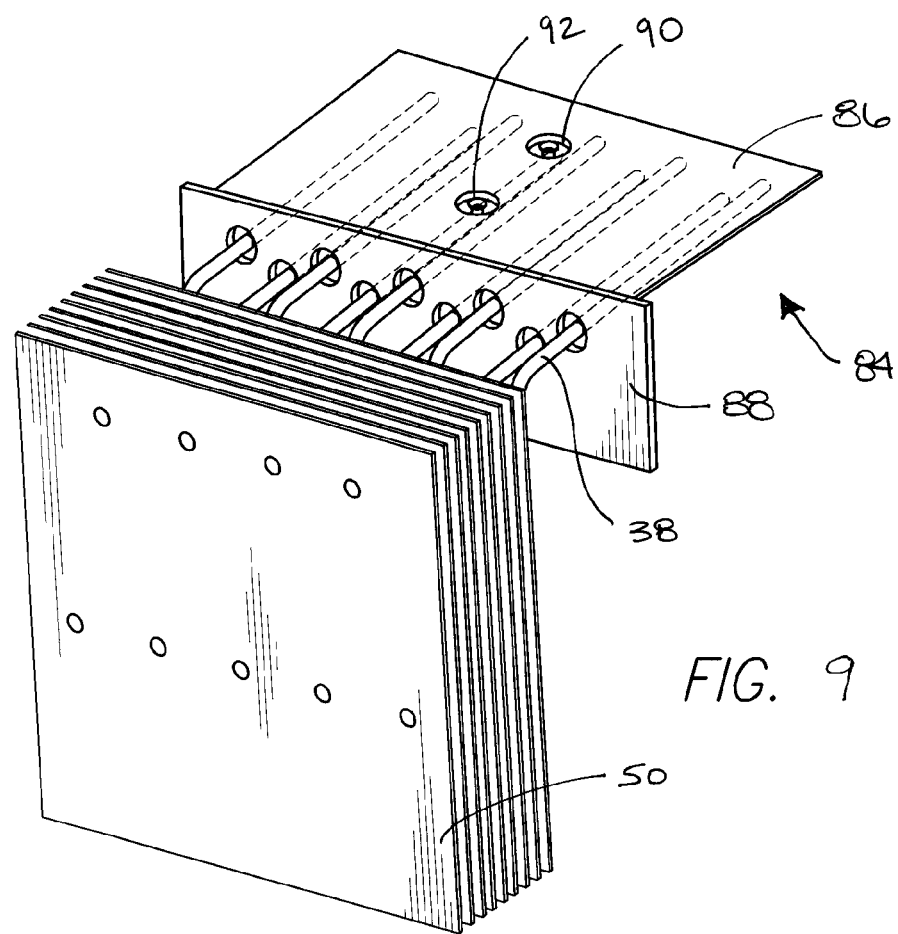
FIG. 9 is a perspective view of the heat pipe sub-assembly showing the condenser coupled to a series of heat pipes, which are coupled to the top cover of the thermal energy storage unit.

Cover 84 of housing 72 includes a top wall 86 and a side wall 88, as shown, for example, in FIG. 10. Cover 84 is adapted to be coupled to housing 72 to form a chamber for receiving phase change material 44. Top wall 86 includes a vent port 90 and a fill port 92 used to fill housing 72. Side wall 88 of housing 72 includes a series of openings 94 adapted to accept heat pipes 38, as shown, for example, in FIG. 9. Openings 94 of side wall 88 are sealed with epoxy 96.

Coupled to housing 72 is a condenser housing 98, as shown, for example, in FIGS. 6 and 7. Condenser housing 98 includes a first side wall 100 and a second side wall 102. Condenser housing 98 also includes tapered wall portion 104 and straight wall portion 106. Condenser housing 98 is adapted to contain condenser 50 and is positioned within convection chimney 54, as shown, for example, in FIG. 7. Condenser housing 98 also includes bottom wall segments 108, 110 and flanges 112, 114 that extend from bottom wall segments 108, 110. Bottom wall segments 108, 110 are adapted to support the weight of condenser 50. With condenser housing 72 positioned within convection chimney 54, air can flow through condenser 50 to remove heat from the thermal energy storage transfer system.

Figure 12:
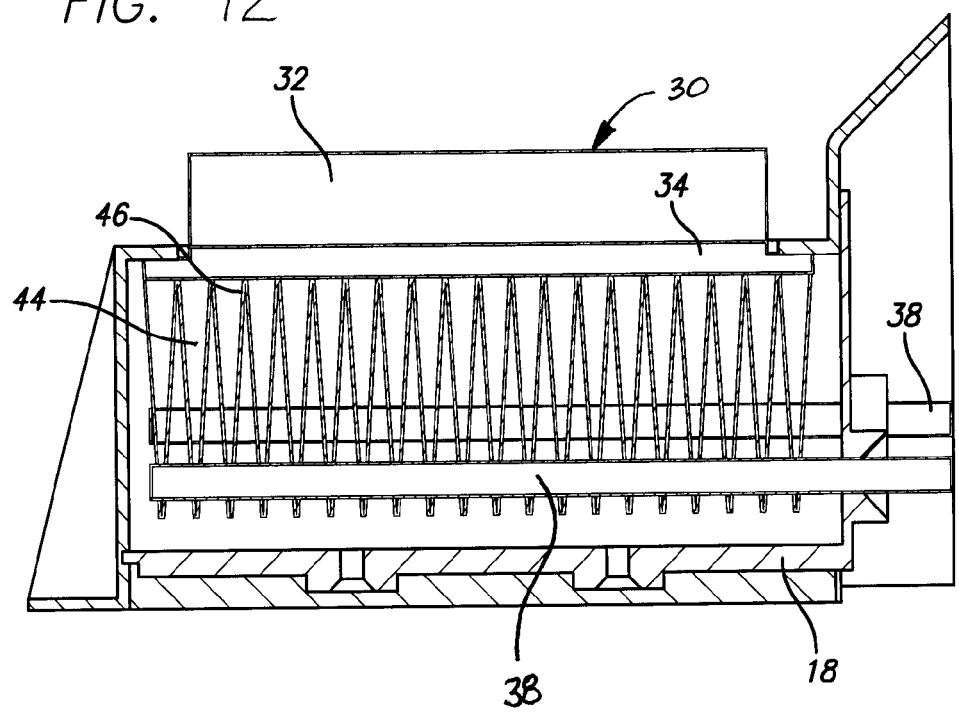
FIG. 12 is a enlarged cross sectional view of FIG. 11 showing the position of the heat sink in connection with the conductive material and the position of the heat tubes with the conductive material.
Figure 11:
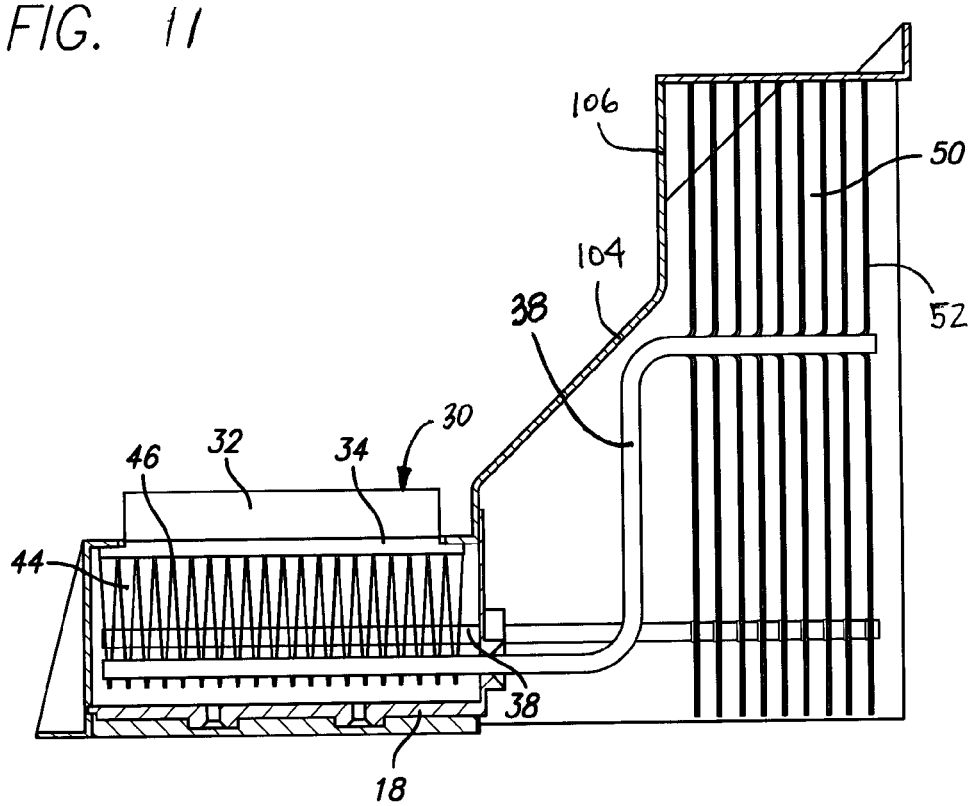
FIG. 11 is a cross sectional view taken along line 11-11 of FIG. 7 showing the conductive material coupled to a series of heat tubes, which are coupled to the condenser fins.

An alternative arrangement for the conductive material 46 is shown, for example, in FIGS. 11 and 12. In this arrangement, conductive material 46 is arranged generally perpendicular to heat sink 30 and heat pipes 38. As shown in FIG. 12, conductive material 46 extends throughout main housing 18 in an undulating pattern. This arrangement allows for uniform heat transfer throughout the phase change material. Multiple heat pipes 38 can be used to transfer heat from the phase change material to the condenser 50. Using an undulating conductive material allows heat pipes 38 to be inserted into housing 18 without the use of conductive plate 45.

While embodiments have been illustrated and described in the drawings and foregoing description, such illustrations and descriptions are considered to be exemplary and not restrictive in character, it being understood that only illustrative embodiments have been shown and described and that all changes and modifications that come within the spirit of the invention are desired to be protected. The applicants have provided description and figures which are intended as illustrations of embodiments of the disclosure, and are not intended to be construed as containing or implying limitation of the disclosure to those embodiments. There are a plurality of advantages of the present disclosure arising from various features set forth in the description. It will be noted that alternative embodiments of the disclosure may not include all of the features described yet still benefit from at least some of the advantages of such features. Those of ordinary skill in the art may readily devise their own implementations of the disclosure and associated methods, without undue experimentation, that incorporate one or more of the features of the disclosure and fall within the spirit and scope of the present disclosure and the appended claims.

What is claimed is:

1. A thermal energy storage transfer system for use with an electronics enclosure having an interior space for electronics, the thermal energy storage transfer system comprising:

a main housing positioned within the interior space of the electronics enclosure;

a phase change material in the main housing and adapted to absorb heat created by the electronics;

a heat sink coupled to the main housing and in communication with the phase change material, the heat sink adapted to transfer heat to the phase change material that is generated by the electronics within the electronics enclosure;

a conductive material positioned within the main housing and embedded within the phase change material, the conductive material adapted to transfer heat from the phase change material;

a heat pipe coupled to the main housing and in communication with the conductive material, the heat pipe arranged to extend from the interior space of the electronics enclosure to a convection chimney associated with the electronics enclosure; and a condenser coupled to the heat pipe and positioned within the convection chimney, the condenser adapted to remove heat from the heat pipe by releasing the heat into air moving through the convection chimney.

2. The thermal energy storage transfer system of claim 1, wherein the heat sink includes a base coupled to the main housing and a series of fins extending from the base.

3. The thermal energy storage transfer system of claim 1, wherein the condenser includes a series of fins coupled to the heat pipe to radiate heat from the heat pipe.

4. The thermal energy storage transfer system of claim 1, further including a second heat pipe coupled to the main housing for transferring heat from the phase change material to the condenser.

5. The thermal energy storage transfer system of claim 1, further including a condenser housing coupled to the main housing, the condenser housing adapted to house the condenser.

6. A thermal energy storage and transfer system for removing heat generated by electronics equipment positioned within an interior space of an electronics enclosure, the thermal energy storage and transfer system comprising:

a main housing positioned within the electronics enclosure;

a phase change material positioned in the main housing, the phase change material adapted to absorb and store heat generated by the electronics equipment within the electronics enclosure;

a heat sink coupled to the main housing and adapted to transfer heat created by the electronics equipment to the phase change material;

a condenser housing coupled to the main housing and positioned outside of the interior space of the electronics enclosure and within a convection chimney;

a condenser positioned within the condenser housing;

at least one heat pipe coupled to the main housing at a first end and to the condenser at a second end, the heat sink adapted to transfer heat stored by the phase change material within the housing to the condenser where air, passing through the convection chimney, contacts the condenser to remove heat from the condenser; and a conductive material positioned within the main housing and embedded within the phase change material, the conductive material adapted to transfer heat from the phase change material to the at least one heat pipe.

7. The thermal energy storage transfer system of claim 6, wherein the heat sink includes a base coupled to the main housing and a series of fins extending from the base.

8. The thermal energy storage transfer system of claim 7, wherein the condenser includes a series of fins coupled to the at least one heat pipe to radiate heat from the at least one heat pipe.

9. The thermal energy storage transfer system of claim 6, further including a second heat pipe coupled to the main housing for transferring heat from the phase change material to the condenser.

10. The thermal energy storage transfer system of claim 6, further including a cover adapted to be coupled to the main housing, the cover including at least one opening adapted to accept a corresponding one of the at least one heat pipe.

11. The thermal energy storage transfer system of claim 10, wherein the cover includes a fill opening and a vent opening to allow the main housing to be filled with the phase change material.

12. An electronics enclosure for electronics equipment comprising:

a convection chimney having an air inlet and an air outlet positioned above the air inlet;

a thermal energy storage unit positioned within the electronics enclosure, the thermal energy storage unit having a main housing;

a phase change material positioned within the main housing, the phase change material adapted to absorb and store heat generated by the electronics equipment within the electronics enclosure;

a heat sink coupled to the main housing and adapted to transfer heat created by the electronics equipment to the phase change material;

a condenser positioned within the chimney;

a heat pipe coupled to the housing at a first end and to the condenser at a second end, the heat pipe adapted to transfer heat stored by the phase change material within the housing to the condenser where air, passing through the chimney, contacts the condenser to remove heat from the condenser; and a conductive material positioned within the housing and embedded within the phase change material, the conductive material adapted to transfer heat from the phase change material to the heat pipe such that heat generated by the electronics equipment is absorbed by the phase change material and transferred through the heat pipe to the condenser where air passing through the chimney removes heat from the condenser.

13. The electronics enclosure of claim 12, wherein the heat sink includes a base coupled to the main housing and a series of fins extending from the base.

14. The electronics enclosure of claim 12, wherein the condenser includes a series of fins coupled to the heat pipe to radiate heat from the heat pipe.

15. The electronics enclosure of claim 12, further including a second heat pipe coupled to the main housing for transferring heat from the phase change material to the condenser.

16. The electronics enclosure of claim 12, further including a condenser housing coupled to the main housing, the condenser housing adapted to house the condenser.

17. The electronics enclosure of claim 12, further including a reflective insulating material lining the inside of the electronics enclosure to reflect heat from the electronics equipment to the heat sink.

* * * * *